(12) United States Patent
Kim et al.

(10) Patent No.: US 7,847,300 B2
(45) Date of Patent: Dec. 7, 2010

(54) LIGHT-EMITTING DIODE PACKAGE

(75) Inventors: Sun-Hong Kim, Incheon (KR); Min-Sik Kim, Seoul (KR); Jin-Na Lee, Gyeonggi-do (KR)

(73) Assignee: Alti-Electronics Co., Ltd., Yongin-si, Gyeonggi-do (KR)

( * ) Notice: Subject to any disclaimer, the term of this patent is extended or adjusted under 35 U.S.C. 154(b) by 214 days.

(21) Appl. No.: 12/078,250

(22) Filed: Mar. 28, 2008

(65) Prior Publication Data

US 2009/0189176 A1    Jul. 30, 2009

(30) Foreign Application Priority Data

Jan. 28, 2008    (KR)    ................ 10-2008-0008489

(51) Int. Cl.
*H01L 29/267*    (2006.01)

(52) U.S. Cl. ................ 257/81; 257/98; 257/99; 257/100; 257/E25.02; 257/E33.058; 257/E33.062; 257/E33.072; 438/22; 438/24; 362/362; 362/375

(58) Field of Classification Search ............ 257/81, 257/99, E25.02, E33.072, 98, 100, E33.058, 257/E33.062; 438/22, 24; 362/362, 375
See application file for complete search history.

(56) References Cited

U.S. PATENT DOCUMENTS

2007/0096114 A1* 5/2007 Aoki et al. ............ 257/79

* cited by examiner

*Primary Examiner*—Long K Tran
(74) *Attorney, Agent, or Firm*—The Nath Law Group; Jerald L. Meyer; Robert T. Burns

(57) ABSTRACT

Disclosed is a light-emitting diode package. The light-emitting diode package includes an electrode pad on which a chip is placed; a housing having a window through which the chip is exposed; a housing wall defining the window; and an electrode lead extended from the electrode pad in a direction of the housing to be exposed outside a surface of the housing, wherein the housing wall formed in the direction comprises a first portion and a second portion thicker than the first portion to cover the electrode lead.

12 Claims, 4 Drawing Sheets

LIGHT-EMITTING DIODE PACKAGE

CROSS-REFERENCE TO RELATED APPLICATION

This application claims priority from and the benefit of Korean Patent Application No. 10-2008-0008489, filed on Jan. 28, 2008, which is hereby incorporated by reference for all purposes as if fully set forth herein.

BACKGROUND OF THE INVENTION

1. Field of the Invention

The present invention relates generally to a semiconductor device, and more particularly, to a light-emitting diode (LED) package.

2. Description of the Related Art

A light-emitting diode, usually called an "LED," is a semiconductor diode that emits incoherent narrow-spectrum light when electrically biased in the forward direction of the p-n junction. This effect is a form of electroluminescence.

LEDs are often used as small indicator lights on electronic devices and increasingly in higher power applications such as flashlights and area lighting.

These LEDs are commonly used in the form of a package together with some other components. LED packages can be classified into top view types and side view types according to their use. The latter are usually used as backlights for small mobile devices, such as cellular phones.

A recent LED package tends to be manufactured in the type of a surface mount device (SMD) that permits the LED package to be very small in size to keep pace with slim and compact designed devices on which to be mounted. A SMD type of LED package includes a housing configuring its appearance, at least one electrode pad, and at least one electrode lead extended from the electrode pad to be exposed outside the housing and bent in a direction of the housing. Such bending of the electrode lead may leave a clearance between the electrode pad and a portion of the housing where the electrode pad meets.

SUMMARY OF THE INVENTION

Accordingly, the present invention has been designed to solve the aforementioned problem and an aspect of the present invention provides a light-emitting diode package with a high reliability and an excellent light efficiency.

Additional features of the invention will be set forth in the description which follows, and in part will be apparent from the description, or may be learned by practice of the invention.

An exemplary embodiment of the present invention provides a light-emitting diode package including: an electrode pad on which a chip is placed; a housing having a window through which the chip is exposed; a housing wall defining the window; and an electrode lead extended from the electrode pad in a direction of the housing to be exposed outside a surface of the housing, wherein the housing wall formed in the direction includes a first portion and a second portion thicker than the first portion to cover the electrode lead.

The electrode lead may be provided in plurality, and the second portion may be provided in the number corresponding to the number of the electrode leads.

An inclined angle between an inner surface of the first portion and the electrode pad may be larger than an inclined angle between an inner surface of the second portion and the electrode pad.

The electrode lead may be bent in a first direction of the housing.

The first direction of the housing may be a rear direction thereof.

The electrode lead may be further bent in a second direction of the housing.

A bottom surface of the housing may include a first bottom surface, and a second bottom surface having a first recessed space in a top direction of the housing so that the electrode lead is arranged in the first recessed space.

The electrode lead may be arranged on the bottom surface of the housing and a side surface of the housing. The side surface of the housing may include a first side surface, and a second side surface having a second recessed space in a side direction of the housing so that the electrode lead is arranged in the second recessed space.

It is to be understood that both the foregoing general description and the following detailed description are exemplary and explanatory and are intended to provide further explanation of the invention as claimed.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
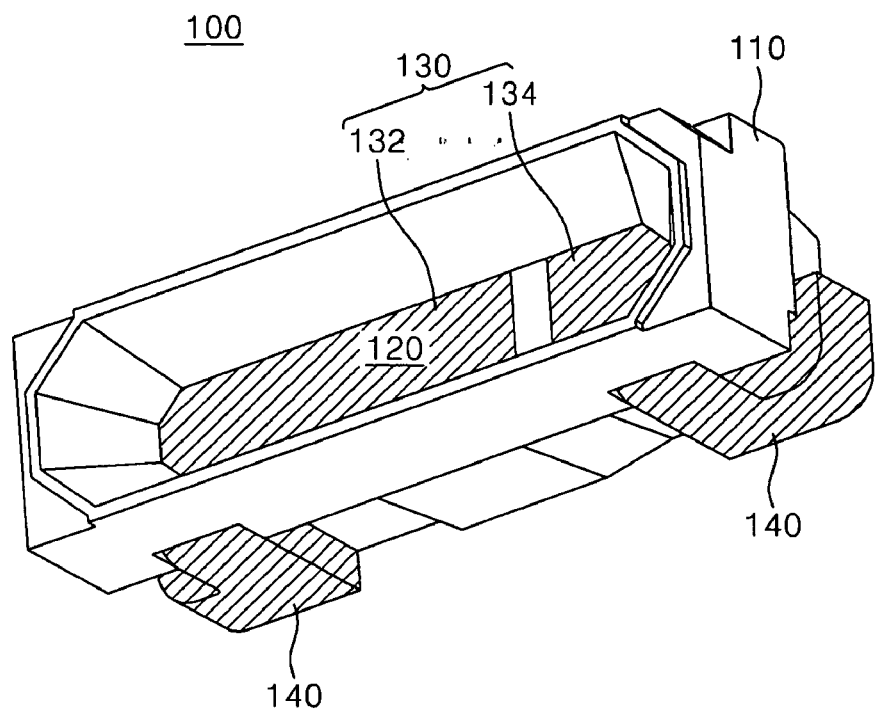
FIG. 1 is a perspective view illustrating an LED package according to an exemplary embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

Throughout the specification, the term "front side" refers to a part of an LED package where a light-emitting surface will be formed, the term "rear side" an opposite side of the front side, and the term "bottom side" a portion of the LED package which is seated on a device to which the LED package will be applied, the term "top side" an opposite side of the bottom side, the term "left side" a left portion of the LED package and "right side" a right portion thereof as seen from the front side.

And, the term "front direction" or "direction of front side", "rear direction" or "direction of rear side", "left direction" or "direction of left side", "right direction" or "direction of right side", "top direction" or "direction of top side", and "bottom direction" or "direction of bottom side", respectively, refer to a direction which the front side, the rear side, the left side, the right side, the top side, and the bottom side look toward, respectively.

Hereinafter, exemplary embodiments of the present invention will be described in more detail with reference to accompanying drawings.

FIG. 1 is a perspective view illustrating an LED package 100 according to an exemplary embodiment of the present invention.

Referring to FIG. 1, LED package 100 includes a housing 110, an electrode pad 130, and an electrode lead 140. Housing 110 includes a front portion and a rear portion. The front portion includes a housing wall formed in top, bottom, left, and right directions. A window 120 is defined by housing wall. Electrode pad 130 is provided between the front portion and the rear portion, more specifically, one side of the electrode pad 130 contacting the bottom surface of the front portion, and the other side contacting the top surface of the rear portion. Electrode lead 140 is extended from electrode pad 130 to be exposed outside the housing 110. Electrode pad 130 may include a first electrode pad 132 and a second electrode pad 134. An LED chip (not shown) is seated on first electrode pad 132, with its positive electrode connected to first electrode pad 132 directly or via a bonding wire (not shown), its negative electrode to second electrode pad 134 via a bonding wire (not shown), and vice versa.

The LED chip and parts of first and second electrode pads 132 and 134 may be externally exposed through window 120.

Transparent resin or other resin that passes specific-spectrum light alone may be filled in window 120.

The resin may contain a phosphor absorbing a certain wavelength of light and emitting another wavelength of light.

LED package 100 may be mounted on a printed circuit board (not shown) of a device (not shown). Electrode lead 140 may be exposed externally from a bottom side of housing 110, extended in the rear direction of LED package 100, and bent subsequently in the left or right direction and in the top direction in such a manner to wrap around an edge portion of the rear portion of housing 110.

The rear portion of housing 110 may be partially recessed to provide spaces in which electrode lead 140 may be accommodated and completely hidden by housing 110 as seen from the front side. Depending on manufacturing processes of LED package 100 or structures of a device on which to be mounted, electrode lead 140 may be formed to protrude slightly beyond the outline of the front portion of LED package 100 as seen from the front side of LED package 100.

Housing 110 may have a hole formed around where electrode lead 140 has been bent.

Figure 2:
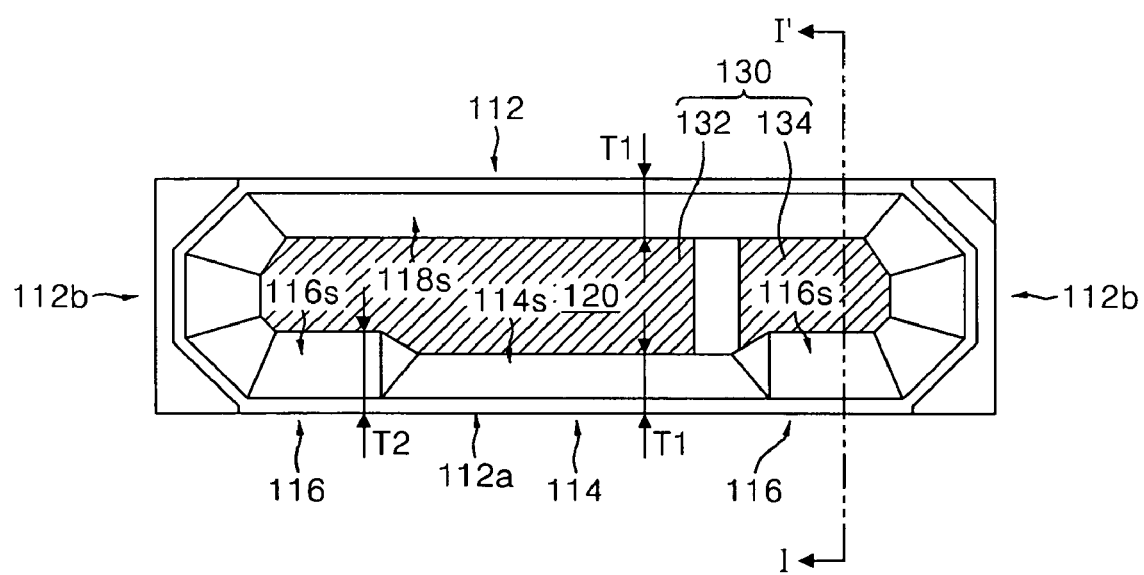
FIG. 2 is a front view of the LED package shown in FIG. 1.

FIG. 2 is a front view of the LED package shown in FIG. 1.

Referring to FIG. 2, window 120 is shown, which is defined by housing wall 112. Light generated from an LED chip (not shown) would be externally emitted through window 120. Lead electrode 130 connected to the LED chip is exposed through window 120. Housing wall 112 may be divided into an upper wall, a lower wall, a left wall, and a right wall. The lower wall may include a first portion 114 with a first thickness T1 and two second portions 116 located at both ends of first portion 114, each with a second thickness T2 larger than the first thickness T1.

As described above with reference to FIG. 1, LED package 100 may include a plurality of lead electrodes 140 (two in FIG. 1) that are extended externally from electrode pad 130 to be exposed outside housing 110. Lead electrodes 140 may be extended parallel with each other.

Lead electrode 140 may be extended through a portion of housing 110 located adjacent to second portion 116. Lead electrode 140 is hidden under second portion 116 not to be seen from the front side of LED package 100. Making second portion 116 thicker than first portion 114 may increase the area of the top surface of lead electrode 140 which abuts the bottom surface of the front portion of housing 110.

An inner wall of the front portion inclined at a prescribed angle to reflect light generated by the LED chip (not shown) may effect the improvement in light efficiency of beams emitted from LED package 100. The lower wall, more specifically first portion 114, of LED package 100 includes a first inner wall 114s and the upper wall includes a second inner wall 118s opposite to first inner wall 114s. First inner wall 114s may be symmetrical to a part of second inner wall 118s.

Figure 3A:
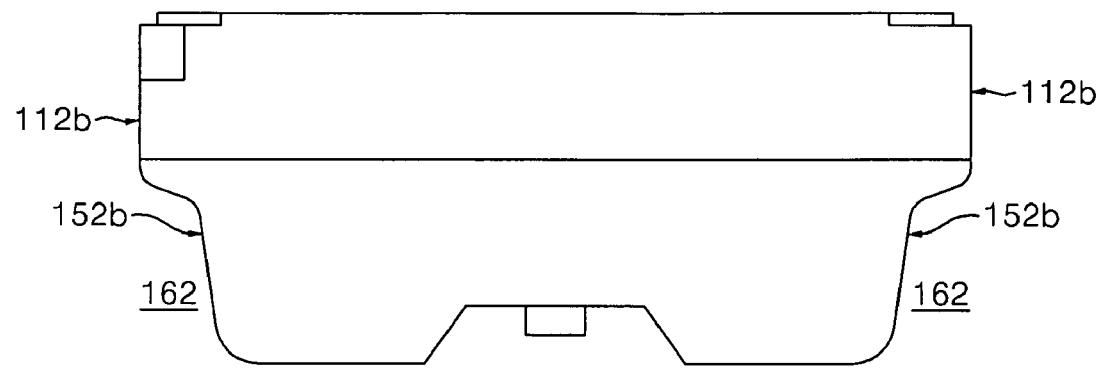
FIG. 3A is a top view illustrating the housing of an LED package according to an exemplary embodiment of the present invention.
Figure 3B:
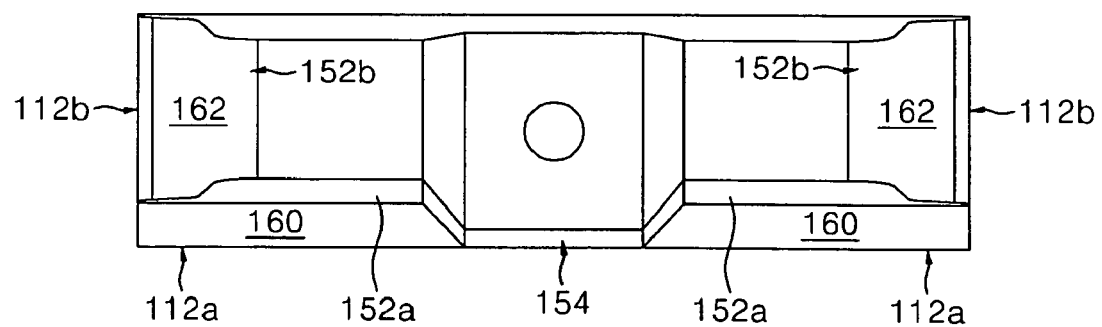
FIG. 3B is a rear view of the housing shown in FIG. 3A.
Figure 3C:
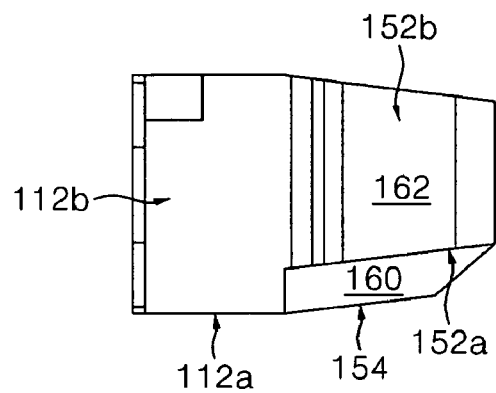
FIG. 3C is a side view of the housing shown in FIG. 3A.

FIG. 3A is a top view illustrating the housing of an LED package according to an exemplary embodiment of the present invention, FIG. 3B is a rear view of the housing shown in FIG. 3A, and FIG. 3C is a side view of the housing shown in FIG. 3A.

Referring to FIGS. 3A to 3C, a bottom surface of housing 110 may include a first bottom surface 112a, which is the bottom surface of the front portion, and a second bottom surface 152a, which is the bottom surface of the rear portion. Second bottom surface 152a is recessed in the top direction of LED package 100 so that the rear portion of housing 110 has a first space 160 as shown in FIG. 3b.

A left surface or a right surface of housing 100 may include a first side surface 112b, which is the side surface of the front portion, and a second side surface 152b, which is the side surface of the rear portion. Second side surface 152b is recessed in the left or right direction of LED package 100 so that the rear portion of housing 110 has a second space 162 as shown in FIG. 3A. Accordingly, a distance between two first side surfaces 112b is larger than a distance between two second side surfaces 152b.

A supporting surface 154 may be formed between two first spaces 160.

Although not shown, electrode lead 140 may be extended from electrode pad 130 outside housing 110 and bent in the rear direction, in the left or right direction, and then in the top direction, so that the extended electrode lead 140 may be arranged in spaces 160 and 162 not to be seen from the front side of LED package 100.

Figure 4:
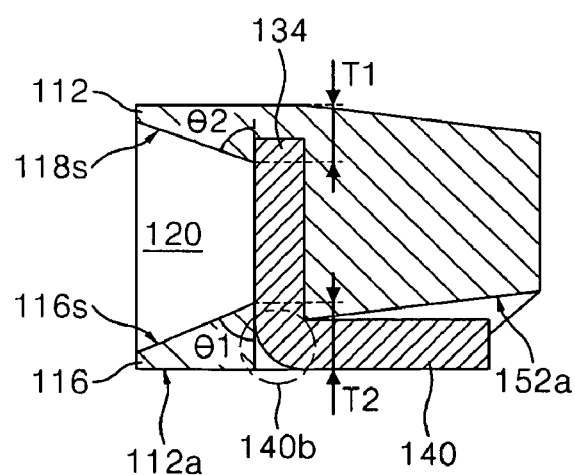
FIG. 4 is a cross sectional view of the LED package taken along the line I-I' of the FIG. 2.
Figure 5:
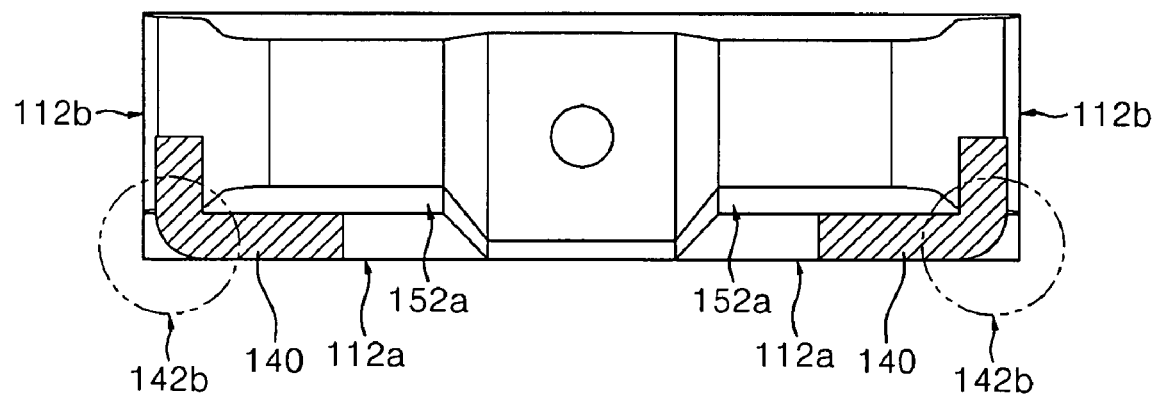
FIG. 5 is a rear view of the LED package shown in FIG. 1.

FIG. 4 is a cross sectional view of the LED package taken along the line I-I' of the FIG. 2, and FIG. 5 is a rear view of the LED package shown in FIG. 1.

Referring to FIGS. 4 and 5, thickness T2 of second portion 116 is thicker than that T1 of the upper wall of housing wall 112 opposite to second portion 116. A thickness of first portion 114 may be equal/different to/from thickness T1. However, thickness T2 of second portion 116 is thicker than that of first portion 114.

Also, an angle θ1 between an inner surface 116s of second portion 116 and electrode pad 134 may be smaller than an angle θ2 between an inner surface 118s of the upper wall and electrode pad 134.

Electrode lead 140 is extended from electrode pad 134 to be exposed outside housing 110 and bent around its first bent portion 140a in the rear direction of LED package 100 to be arranged in first space 160. And, electrode lead 140 is further bent around a second bent portion 140b to be arranged in second space 162.

As described above, making second portion 116 thicker than other portions of housing wall 112 may increase the area of the top surface of lead electrode 140 which abuts the bottom surface of the front portion of housing 110, and this may prevent the occurrence of a clearance therebetween.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A light-emitting diode package comprising:
   an electrode pad on which a chip is placed;
   a housing having a window through which the chip is exposed;
   a housing wall defining the window; and
   an electrode lead extended from the electrode pad through the housing to be exposed in a first direction of the housing,
   wherein the housing wall formed in the first direction comprises a first portion and a second portion, the second portion thicker than the first portion to cover the electrode lead.

2. The light-emitting diode package of claim 1, wherein
   the electrode lead exposed in the first direction of the housing is provided in plurality, and
   the second portion of the housing wall is provided in the number corresponding to the number of the electrode leads.

3. The light-emitting diode package of claim 1, wherein an inclined angle between an inner surface of the first portion and the electrode pad is larger than an inclined angle between an inner surface of the second portion and the electrode pad.

4. The light-emitting diode package of claim 1, wherein the electrode lead is bent to an outside surface of the housing.

5. The light-emitting diode package of claim 4, wherein the electrode lead is bent to a rear direction of the housing.

6. The light-emitting diode package of claim 4, wherein the electrode lead is extended from a terminal of the electrode lead and further bent in a second direction of the housing.

7. A light-emitting diode package, comprising:
   an electrode pad on which a chip is placed;
   a housing having a window through which the chip is exposed;
   a housing wall defining the window; and
   an electrode lead extended from the electrode pad in a direction of the housing to be exposed outside a surface of the housing,
   wherein the housing wall formed in the direction comprises a first portion and a second portion, the second portion thicker than the first portion to cover the electrode lead,
   wherein the electrode lead is bent in a first direction of the housing, and
   wherein a bottom surface of the housing comprises
   a first bottom surface, and
   a second bottom surface having a first recessed space in a top direction of the housing so that the electrode lead is arranged in the first recessed space.

8. The light-emitting diode package of claim 7, wherein the electrode lead is arranged on the bottom surface of the housing and a side surface of the housing.

9. The light-emitting diode package of claim 8, the side surface of the housing further comprising:
   a first side surface; and
   a second side surface having a second recessed space in a side direction of the housing so that the electrode lead is arranged in the second recessed space.

10. A light-emitting diode package comprising:
    an electrode pad on which a chip is placed;
    a housing having a window through which the chip is exposed;
    a housing wall defining the window; and
    an electrode lead extended from the electrode pad through the housing to be exposed in a first direction of the housing,
    wherein the electrode lead is bent to an outside surface of the housing at through the housing, and
    wherein a bottom surface of the housing comprises
    a first bottom surface, and
    a second bottom surface having a first recessed space in a top direction of the housing so that the electrode lead is arranged in the first recessed space.

11. The light-emitting diode package of claim 10, wherein the electrode lead is arranged on the bottom surface of the housing and a side surface of the housing.

12. The light-emitting diode package of claim 11, wherein the side surface of the housing further comprises:
    a first side surface; and
    a second side surface having a second recessed space in a side direction of the housing so that the electrode lead is arranged in the second recessed space.

* * * * *